July 11, 1967 R. L. LUCE ET AL 3,331,001
ULTRA-HIGH SPEED PLANAR TRANSISTOR EMPLOYING OVERLAPPING BASE AND COLLECTOR REGIONS
Filed Dec. 9, 1963
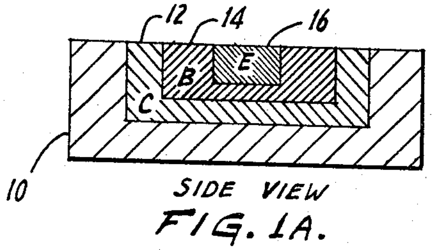
SIDE VIEW
FIG. 1A.
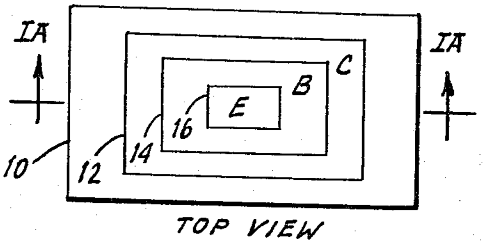
TOP VIEW
FIG. 1B.
FIG. 1. PRIOR ART PLANAR TRANSISTOR
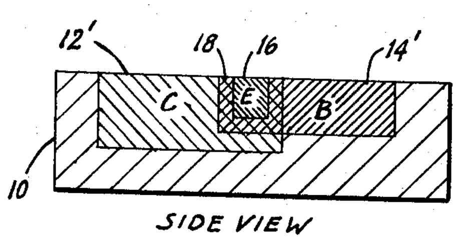
SIDE VIEW
FIG. 2A.
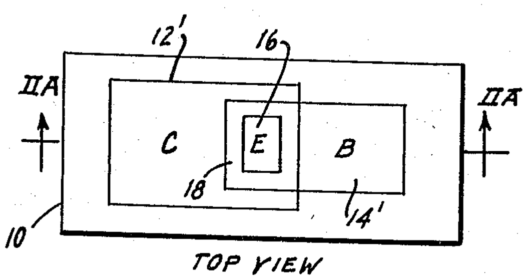
TOP VIEW
FIG. 2B.
FIG. 2. OVERLAP TRANSISTOR
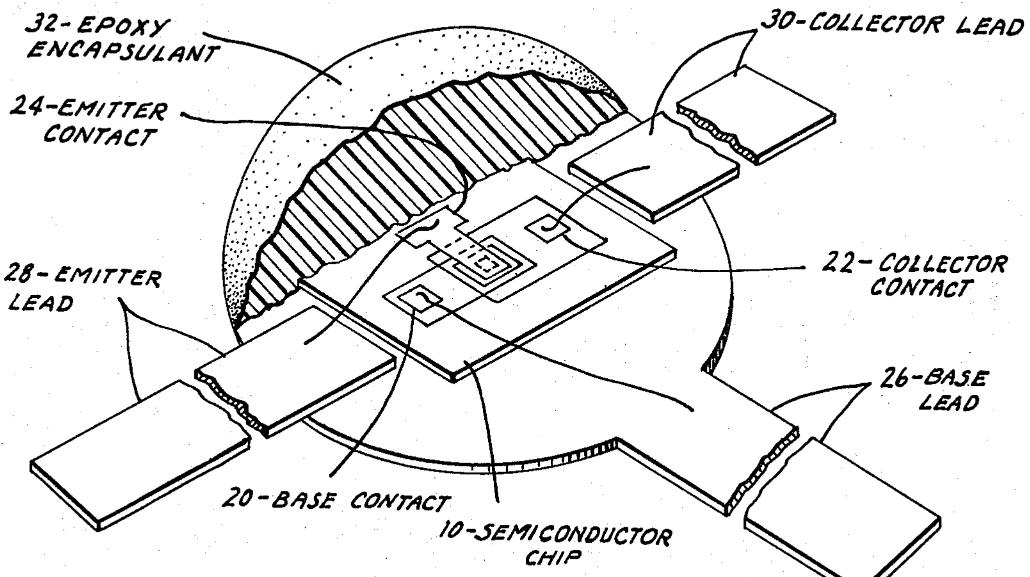
FIG. 3. EPOXY ENCAPSULATED OVERLAP TRANSISTOR
INVENTORS
ROBERT L. LUCE
EARL S. SCHLEGEL
BY D R Pressman
ATTORNEY United States Patent Office 3,331,001

Patented July 11, 1967

3,331,001

ULTRA-HIGH SPEED PLANAR TRANSISTOR EMPLOYING OVERLAPPING BASE AND COLLECTOR REGIONS

Robert L. Luce, Harleysville, and Earl S. Schlegel, Lansdale, Pa., assignors to Philco Corporation, Philadelphia, Pa., a corporation of Delaware Filed Dec. 9, 1963, Ser. No. 329,138
8 Claims. (Cl. 317—235)

This invention relates generally to transistor structures, and in particular to a new type of planar transistor having ultra-high-speed switching capabilities.

Recent advances in transistor technology have provided transistors capable of operating at frequencies and switching speeds not previously realizable. For example, transistor basewidths, which heretofore tended to limit minority carrier transit time, have been reduced in thickness to ranges providing almost insignificant limiting effect. Emitter-base junctions, which heretofore tended to produce deleterious shunt capacities, have been reduced in area to provide a similar improvement. The design of transistor enclosures has been perfected so as to have almost negligible effect on transistor operation.

One remaining problem is that of large-area collector-base junctions, which, when associated with the extremely thin collector depletion zones presently used, tend to produce large collector capacitances shunting the base circuit. This limits the transistor's high frequency operation. Reduction of the collector-base junction area has not been feasible without a concomitant reduction in collector and base contact areas and a consequent increase in collector and base series resistances. Large collector and base series resistances tend to increase undesirably the inherent RC time constants of the transistor and thus limit high frequency performance. The problem of these high inherent resistances cannot be eliminated simply by increased doping levels since the resultant low resistivity structures tend to have narrower depletion zones which provide undesirable higher inherent capacitances.

*Objects*

Accordingly, several objects of the present invention are:

(1) To provide a transistor having improved high frequency performance capabilities.

(2) To provide a transistor having a low collector-base capacitance without concomitant high collector and base inherent resistances.

(3) To provide a transistor having large-area collector-base external contact areas without a large collector-base capacitance.

Other objects and advantages of the present invention will be apparent from a consideration of the ensuing description thereof.

*Summary*

According to the present invention, a low collector capacitance planar transistor is constructed by forming in a semiconductive body overlapping base and collector regions with an emitter region formed in the region of overlap. Area contacts are affixed to the non-overlapping portions of said base and collector regions to provide low inherent base and collector resistances.

*Drawing*

FIG. 1A shows a sectional view of a typical prior art planar transistor taken along the line IA—IA of FIG. 1B;

FIG. 1B is a top view of the transistor shown in section in FIG. 1A;

FIG. 2A shows a sectional view of the overlap transistor of the invention taken along the line IIA—IIA of FIG. 2B;

FIG. 2B is a top view of the transistor shown in section in FIG. 2A; and

FIG. 3 is a perspective view of a complete overlap transistor including encapsulant and connecting leads.

*FIG. 1.—Prior art planar transistor*

FIG. 1 shows side-sectional and top views of a typical prior art planar transistor structure as exemplified in Patents 2,981,877 and 3,064,167. For the purposes of clarity only the semiconductor per se is illustrated; it will be understood that a complete transistor may include a supporting substrate, passivating (protecting) surface oxide, connecting leads, case with encapsulant, etc.

In the structure of FIG. 1, 10 indicates a chip of substantially intrinsic or lightly doped (high resistivity) semiconductive material such as Si or Ge, 12 is a diffused collector region of one conductivity, 14 is a base region of opposite conductivity diffused within the confines of said collector region, and 16 is an emitter region of said one conductivity diffused within the confines of said base region. In practice, the surface geometry illustrated in FIG. 1B may take more complex shapes than shown if desired.

It has been noted that the operating frequency of the device of FIG. 1 is restricted principally by the large interelement capacitance existing between base 14 and collector 12. This large capacitance stems from the relatively large area of the base-collector junction. Reduction of the area of this junction can be accomplished by reduction of the volume of base region 14, but this would decrease the contactable surface area of region 14, which would necessitate smaller surface contacts and a consequent undesirable increase in the base series resistance.

The overlap transistor of the present invention provides a method of reducing the base-collector capacitance without reducing the contactable surface areas of the base and collector.

*FIG. 2.—Overlap transistor*

An overlap transistor according to the invention is illustrated in FIG. 2, wherein elements having identical counterparts in FIG. 1 have been identified with identical reference numerals, and elements having analogous counterparts in FIG. 1 have been identified with primed reference numerals. As in FIG. 1 the transistor is shown without contacts, connecting leads, passivating oxide, encapsulant, etc., for purposes of illustration.

Collector region 12' is diffused into the lefthand portion of semiconductor chip 10 and base region 14' is diffused into the righthand portion thereof so that a portion of region 14' overlaps a portion of region 12', forming a region of overlap 18. Emitter region 16 is diffused into overlap region 18.

It will be recalled that chip 10 is substantially intrinsic or has a very light doping. If the doping type of chip 10 is similar to base 14', chip 10 will form an effective extension of base 14' so that the actual base-collector junction will be coincident with the entire internal boundary of collector 12'. If the doping type of chip 10 is similar to collector 12', then the actual base-collector junction will be coincident with the entire internal boundary of base 14'. Despite this large area of the base-collector junction, its capacitance will be small since the only effective capacitance will be contributed by that part of the base-collector junction coincident with the intersection of base 14' and collector 12', i.e., the internal boundary of overlap region 18'. The other portion of the base-collector junction (defined by the internal boundary of the base or collector and chip 10) will contribute no significant capacitance due to the light doping level of chip 10.

The reduction in base-collector capacitance is obtained without an increase in base or collector series resistance since the base and collector regions have large surface areas to which large area metal contacts can be affixed. In fact the collector surface area in the overlap transistor is actually greater, for a given collector volume, than in the prior art structure of FIG. 1. This decrease in capacitance, coupled with lower element series resistivity made possible by large area contacts, provides a substantial increase in the high frequency capabilities of the transistor.

*FIG. 3.—Epoxy encapsulated overlap transistor*

In FIG. 3 is shown a cutaway view of an overlap transistor according to the invention including epoxy encapsulant and element leads. The transistor is formed by diffusing collector, base, and emitter areas into semiconductor chip 10. Before and during this diffusion a conventional passivating oxide is formed on the surface of the chip. Holes are cut into the surface oxide over the respective elements and localized metal contact areas are deposited on the resultant structure as by vacuum evaporation to contact the respective elements through the holes formed in the oxide. The base contact is shown at 20 and the collector contact at 22. The emitter contact 24 is made to extend from the emitter region past the active area of the transistor to form a contact area on the semiconductor chip since the portion of the emitter contact covering the emitter region is too small to properly affix a lead wire thereto. A base lead 26 is physically attached to the underside of the chip although insulated therefrom by the passivating oxide on the chip. The base lead does not form any significant capacitance with the chip since the spacing is relatively large and the area relatively small. The emitter and collector leads 28 and 30 are positioned as shown and connecting wires are connected from the three contact areas to the three leads respectively. Tests have indicated that this form of encapsulation alone is sufficient protection for the transistor; however a standard "can" may be also used if desired.

The instant invention is not limited to the details of the foregoing description since many modifications thereof which fall within the true scope of the inventive concept will be apparent to those conversant with the art. The invention is defined only by the appended claims.

We claim:

1. A planar transistor, comprising:
 a body of substantially intrinsic semiconductive material having a planar surface,
 a collector region of one conductivity type diffused into one area of said surface to a first depth, said one area having a given width, as measured in one direction in the plane of said surface,
 a base region of the opposite conductivity type diffused into an elongated area of said surface to a depth less than said first depth, the longer axis of said elongated area being oriented orthogonally to said one direction, said elongated area having a width, as measured in said one direction, which is less than said given width, one end of said elongated area overlying a portion of said collector region so that a portion of said collector region will surround one end of said base region and the other end of said base region will be contiguous said intrinsic material of said body, and
 an emitter region of said one conductivity type diffused to a depth less than the depth of said base region into another area of said surface within the boundary of said end of said elongated area which overlies said collector region such that said emitter region is completely separated from said collector region by said base region.

2. The transistor of claim 1 wherein the configurations of said one area, said elongated area, and said other area of said surface are all rectangular.

3. The transistor of claim 1 wherein a metallic collector area contact is evaporated over another portion of said one area of said surface separate from said first-named portion thereof, and wherein a metallic base area contact is evaporated over the other end of said elongated area of said surface.

4. In a planar transistor of the type comprising a body of substantially intrinsic semiconductive material having a planar surface into which are diffused emitter and collector regions of one conductivity type and an elongated base region of the opposite conductivity type, and in which the collector region is diffused to a greater depth than said emitter region and said base region is diffused to a depth intermediate the depths of said emitter and collector regions and completely separates said emitter and collector regions, said elongated base region having a width, measured in the plane of said surface, which is less than the dimension of said collector region as correspondingly measured in the plane of said surface in a direction orthogonal to the longer dimension of said elongated base region,
 the improvement wherein said base region is oriented such that the internal surface of one end thereof is surrounded by a portion of said collector region, said emitter region being formed within said one end thereof, the internal surface of the other end of said base region being contiguous said substantially intrinsic material of said body, whereby the collector capacitance of said transistor will be reduced and a large area surface contact can be affixed to said collector region to provide reduced collector series resistance.

5. A planar transistor comprising a body of substantially intrinsic semiconductive material having a planar surface and having collector, base, and emitter regions diffused to successively decreasing depths in said surface, said base region being elongated, having a conductivity type opposite to that of said collector and emitter regions, and completely separating said emitter and collector regions, the dimension of said collector region orthogonal to the longer dimension of said base region being greater than the width of said base region,
 said transistor being characterized in that said base region is diffused into an elongated area of said surface of said wafer which has one end which overlies a portion of said collector region, said emitter region being diffused into said one end of said elongated area, such that the internal surface of one end of said base region will be surrounded by a portion of said collector region and the other end of said base region will be contiguous said intrinsic material of said semiconductor body.

6. The transistor of claim 5 wherein said base and collector regions have substantially rectangular surface configurations.

7. The transistor of claim 5 further including a metallic collector area surface contact evaporated over another portion of said collector region and a metallic base area surface contact evaporated over said other end of said base region.

8. A planar transistor comprising:
 a body of substantially intrinsic semiconductive material having a planar surface,
 a collector region of one conductivity type diffused into a first area of said surface to a first depth,
 a base region of the opposite conductivity type diffused into a second area of said surface to a depth less than said first depth,
 one portion of said second area overlying a portion of said collector region so that a portion of said collector region will surround on at least three sides one extremity of said base region and the other extremity of said base region will be contiguous said intrinsic material of said body, and
 an emitter region of said one conductivity type diffused to a depth less than the depth of said base region into another area of said surface within the boundary of said second area which overlies said portion of said collector region such that said emitter region is completely separated from said collector region by said base region.

References Cited

UNITED STATES PATENTS

| | | | |
|---|---|---|---|
| 2,681,993 | 6/1954 | Shockley | 317—235 |
| 2,959,719 | 11/1960 | Ezaki | 317—235 |
| 2,981,877 | 4/1961 | Noyce | 317—235 |
| 3,015,763 | 1/1962 | Bailey | 317—234 |
| 3,029,366 | 4/1962 | Lehovec | 317—235 |
| 3,030,562 | 4/1962 | Maiden et al. | 317—235 |
| 3,184,657 | 5/1965 | Moore | 317—235 |

FOREIGN PATENTS

| | | |
|---|---|---|
| 900,253 | 12/1953 | Germany. |

JOHN W. HUCKERT, *Primary Examiner.*

J. D. CRAIG, *Assistant Examiner.*